(12) United States Patent
Hsu et al.

(10) Patent No.: US 10,886,433 B2
(45) Date of Patent: Jan. 5, 2021

(54) LIGHT-EMITTING DEVICE HAVING A PATTERNED SUBSTRATE AND THE METHOD THEREOF

(71) Applicant: EPISTAR CORPORATION, Hsinchu (TW)

(72) Inventors: Ta-Cheng Hsu, Hsinchu (TW);
Ching-Shian Yeh, Hsinchu (TW);
Chao-Shun Huang, Hsinchu (TW);
Ying-Yong Su, Hsinchu (TW); Ya-Lan Yang, Hsinchu (TW); Ya-Ju Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 15 days.

(21) Appl. No.: 16/453,520

(22) Filed: Jun. 26, 2019

(65) Prior Publication Data

US 2019/0319170 A1 Oct. 17, 2019

Related U.S. Application Data

(63) Continuation of application No. 16/049,337, filed on Jul. 30, 2018, now Pat. No. 10,374,125, which is a (Continued)

(30) Foreign Application Priority Data

Jul. 28, 2006 (TW) .................. 95127924 B

(51) Int. Cl.
*H01L 33/22* (2010.01)
*H01L 33/00* (2010.01)
*H01L 33/32* (2010.01)

(52) U.S. Cl.
CPC .......... *H01L 33/22* (2013.01); *H01L 33/007* (2013.01); *H01L 33/32* (2013.01)

(58) Field of Classification Search
CPC .................................................. H01L 33/22
See application file for complete search history.

(56) References Cited

U.S. PATENT DOCUMENTS

| 6,657,236 B1 | 12/2003 | Thibeault et al. |
| 2001/0029086 A1 | 10/2001 | Ogawa et al. |

(Continued)

FOREIGN PATENT DOCUMENTS

| CN | 1945864 A | 4/2007 |
| JP | 2002280611 A | 9/2002 |
| TW | I288491 B | 3/1995 |

*Primary Examiner* — Donald L Raleigh
(74) *Attorney, Agent, or Firm* — Ditthavong & Steiner, P.C.

(57) ABSTRACT

A light-emitting device comprises a textured substrate comprising a plurality of textured structures, wherein the textured structures and the textured substrate are both composed of sapphire; and a light-emitting stack overlaying the textured substrate, comprising a first conductivity type semiconductor layer, an active layer, and a second conductivity type semiconductor layer, wherein each of the plurality of textured structures comprises a top portion having a first top-view shape, and a bottom portion parallel to the top portion and having a second top-view shape, wherein the first top-view shape comprises a circle or an ellipse, the first top-view shape comprises a first periphery and the second top-view shape comprises a second periphery, the first periphery is enclosed by the second periphery, and various distances are between each of the first periphery and the second periphery.

12 Claims, 10 Drawing Sheets

Related U.S. Application Data continuation of application No. 15/691,357, filed on Aug. 30, 2017, now Pat. No. 10,038,116, which is a continuation of application No. 14/986,791, filed on Jan. 4, 2016, now Pat. No. 9,780,259, which is a continuation of application No. 13/618,544, filed on Sep. 14, 2012, now Pat. No. 9,231,151, which is a continuation of application No. 12/860,599, filed on Aug. 20, 2010, now Pat. No. 8,648,522, which is a continuation of application No. 11/878,961, filed on Jul. 30, 2007, now Pat. No. 7,825,577.

(56) References Cited

U.S. PATENT DOCUMENTS

| | | |
|---|---|---|
| 2004/0026700 A1 | 2/2004 | Akaike et al. |
| 2004/0113166 A1 | 6/2004 | Tadatomo et al. |
| 2004/0129929 A1 | 7/2004 | Okuyama et al. |
| 2004/0266043 A1 | 12/2004 | Oohata et al. |
| 2005/0145872 A1 | 7/2005 | Fang et al. |
| 2005/0179130 A1 | 8/2005 | Tanaka et al. |
| 2005/0221521 A1 | 10/2005 | Lee et al. |
| 2006/0049411 A1 | 3/2006 | Nakamura et al. |
| 2006/0054905 A1 | 3/2006 | Schwach et al. |
| 2006/0208273 A1 | 9/2006 | Kang |
| 2006/0267025 A1 | 11/2006 | Wuu et al. |
| 2006/0278888 A1 | 12/2006 | Kim et al. |
| 2007/0108459 A1 | 5/2007 | Lu |
| 2007/0158661 A1 | 7/2007 | Lu et al. |
| 2007/0206130 A1 | 9/2007 | Wuu et al. |
| 2007/0257271 A1 | 11/2007 | Ouderkirk et al. |
| 2008/0067916 A1 | 3/2008 | Hsu et al. |
| 2008/0210957 A1 | 9/2008 | Watanabe et al. |
| 2009/0159907 A1 | 6/2009 | Wang |
| 2018/0351122 A1* | 12/2018 | Shinotsuka ......... H01L 51/0034 |

* cited by examiner

LIGHT-EMITTING DEVICE HAVING A PATTERNED SUBSTRATE AND THE METHOD THEREOF

REFERENCE TO RELATED APPLICATION

The present application is a continuation application of U.S. patent application Ser. No. 16/049,337, filed on Jul. 30, 2018, now pending, which is a continuation application of U.S. patent application Ser. No. 15/691,357, filed on Aug. 30, 2017, now issued, which is a continuation application of U.S. patent application Ser. No. 14/986,791, filed on Jan. 4, 2016, now issued, which is a continuation application of U.S. patent application Ser. No. 13/618,544, filed on Sep. 14, 2012, now issued, which is a continuation application of U.S. patent application Ser. No. 12/860,599, filed on Aug. 20, 2010, now issued, which is a continuation application of U.S. patent application Ser. No. 11/878,961, filed Jul. 30, 2007, now U.S. Pat. No. 7,825,577, which claims the right of priority based on Taiwan Application Serial Number 095127924, filed Jul. 28, 2006, the disclosure of which is incorporated herein by reference in their entireties.

TECHNICAL FIELD

This invention relates to a light-emitting device, and more particularly to a light-emitting device having a patterned substrate and the method thereof.

BACKGROUND OF THE DISCLOSURE

Light-emitting diodes (LEDs) have become a symbol of energy-saving industry owing to their low power consumption and long operation life. Meanwhile, LEDs are generally expected to replace traditional fluorescent illumination devices. Whether the LEDs can be broadly implemented in a variety of lighting apparatus or not depends on their light-emitting efficiency and cost. Therefore, how to increase the light extraction efficiency becomes one of the decisive factors to improve the light-emitting efficiency.

Surface roughening has been an effective means to enhance the light-extraction efficiency, whether on a substrate or on a top semiconductor layer. In the U.S. Pat. No. 6,091,085, as shown in FIG. 1, Lester discloses a light-emitting device having a surface-roughened substrate. LED 10 comprises a sapphire substrate 11 and a plurality of protrusions 111 and depressions 112 formed therein for scattering light emitted from a light-emitting layer 14. Therefore the light extraction efficiency of the light-emitting device is enhanced. The plurality of protrusions 111 and depressions 112 are formed by randomly roughening the surface of the substrate 11 by mechanically polishing or reactive-ion-etching (RIE). Although the light extraction efficiency is enhanced because of the roughened surface of the substrate 11, the surface damages such as the alteration of the surface composition and the lattice distortion are resulted from the roughening process as well. Besides, part of the mask materials or the reactive ions are sputtered onto and even doped into a certain depth of the substrate, therefore the quality of the epitaxy layer deposited thereafter is downgraded. The mechanical polishing process also damages the lattice structure of the substrate surface, such that the quality of the successively grown semiconductor layer, such GaN, is worse, and the internal quantum efficiency is lowered.

Wang et al. published a paper in Journal of The Electrochemical Society, 153(3) C182-185 studying a maskless method for Epitaxial Lateral Overgrowth (ELOG) to grow GaN layer. The purpose of the paper is to simplify the complexity of the traditional ELOG process using SiO2 as a hard mark. The study focuses on growing a GaN film having a lattice structure with lower defect density on a sapphire substrate, especially with lower threading dislocation defects (TDDs) caused by the lattice mismatch between the sapphire substrate and the GaN film. Wet etching scheme is utilized to form plural trenches of V shape or U shape, and further correlate the influence of the exposed facets of the sapphire substrate formed under different etching conditions upon the TDD density of subsequently-formed ELOG GaN film.

SUMMARY OF THE DISCLOSURE

One aspect of the disclosure proposes a light-emitting device having a patterned substrate. The patterned substrate comprises an uneven surface for scattering light emitted from a light-emitting layer.

Another aspect of the disclosure proposes a light-emitting device having a patterned substrate comprising a plurality of protrusions and/or depressions. At least one of the depressions and/or extrusions comprises a top portion, a bottom portion, and a sidewall portion enclosing the top portion and the bottom portion, and at least part of the sidewall portion comprises a curve for facilitating the subsequent epitaxy deposition.

In a preferred embodiment, the surface of the depressions and/or protrusions has fewer lattice damages. The sidewall portion comprises a plurality of symmetric planes. At least one of the top portion and the bottom portion comprises a flat plane.

In another preferred embodiment, the uneven surface further comprises a rough surface formed on at least one of top portion, the bottom portion, and the sidewall portion.

A light-emitting device comprises a textured substrate comprising a plurality of textured structures, wherein the textured structures and the textured substrate are both composed of sapphire; and a light-emitting stack overlaying the textured substrate, comprising a first conductivity type semiconductor layer, an active layer, and a second conductivity type semiconductor layer, wherein each of the plurality of textured structures comprises a top portion having a first top-view shape, and a bottom portion parallel to the top portion and having a second top-view shape, wherein the first top-view shape comprises a circle or an ellipse, the first top-view shape comprises a first periphery and the second top-view shape comprises a second periphery, the first periphery is enclosed by the second periphery, and various distances are between each of the first periphery and the second periphery.

A light-emitting device comprises a textured substrate comprising a boundary and a plurality of textured structures within the boundary, wherein the textured structures and the textured substrate are both composed of sapphire; and a light-emitting stack overlaying the textured substrate, comprising a first conductivity type semiconductor layer, an active layer, and a second conductivity type semiconductor layer, wherein one of the plurality of textured structures is constituted by a plurality of symmetric planes intersecting at a point.

DETAILED DESCRIPTION OF THE PREFERRED EMBODIMENTS

Figure 1:
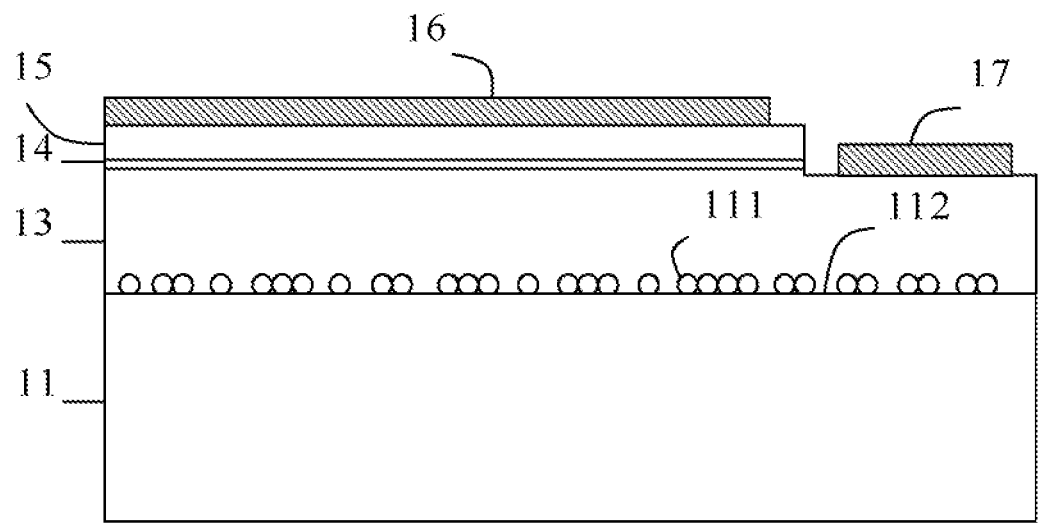
FIG. 1 shows a light-emitting device in accordance with the prior art.
Figure 2A:
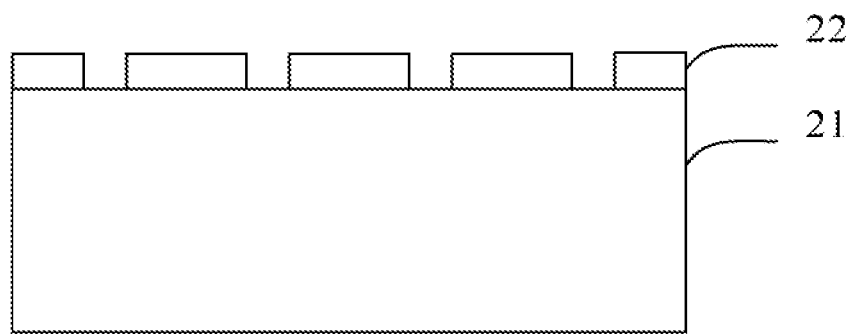
FIGS. 2A to 2E demonstrate the steps of an exemplary method for fabricating the light-emitting device in accordance with the first embodiment of the present disclosure.

FIGS. 2A to 2E demonstrate an exemplary manufacturing method in accordance with the first embodiment of the present disclosure. As shown in FIG. 2A, a substrate 21 is firstly provided wherein the substrate 21 comprises at least one material selected from the group consisting of sapphire, GaN, SiC, Si, GaAs, and other substrate material that can be used to grow III-V semiconductor on it. Subsequently, a patterned hard mask layer 22, such as silicon dioxide ($SiO_2$), is formed on the substrate 21. The patterned mask layer 22 can be achieved by forming a photoresist layer on a hard mask layer pre-deposited on the substrate 21, then performing lithography and etching process for defining and transferring the predetermined pattern to the hard mask layer. After removing the photoresist layer, the patterned hard mask layer 22 is formed as a protection film against the subsequent wet etching.

Figure 2B:
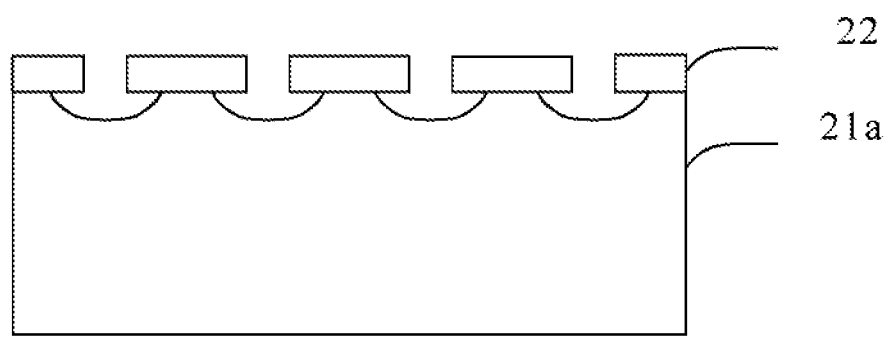

FIG. 2B shows the step for transferring the predetermined pattern from the patterned hard mask layer 22 to the substrate 21 to form a plurality of depressions on the surface of the patterned substrate 21a by a wet etching process. The wet etching process comprises the step of dipping the substrate 21 having a patterned hard mask layer 22 thereon in a phosphoric acid ($H_3PO_4$) based solution. It is preferred to perform the wet etching process under high temperature condition such as 250 to 350° C. It is also preferred to mix a quantity of sulfuric acid ($H_2SO_4$) into the $H_3PO_4$ based solution to increase the boiling point of the solution. It is also preferred that the proportion of $H_3PO_4$ in the solution should be greater than $H_2SO_4$ so the $H_3PO_4$ can stay as a base. A preferred ratio of $H_3PO_4$ to $H_2SO_4$ is around 2:1. The proper operating temperature is set to around 250 to 350° C. Operating in lower temperature will result in lower etching rate and prolong the etching time; whereas, operating in higher temperature will render the solution easily volatile, therefore alter the concentration of the etching solution, and affect the stability of the etching rate and product performance. Furthermore, the life-cycle of the etching solution is shortened, therefore the manufacturing cost is increased. Moreover, high-temperature process is a potential risk to the public safety. According to one embodiment of the disclosure, the etching rate is around 0.6 to 1 micron/min. under the condition of operating temperature of 320° C. and the composition ratio of $H_3PO_4$ to $H_2SO_4$ being 2:1. The etching time is controlled within a predetermined time range to produce the depressions having a flat bottom portion, as shown in FIG. 2B.

Figure 2C:
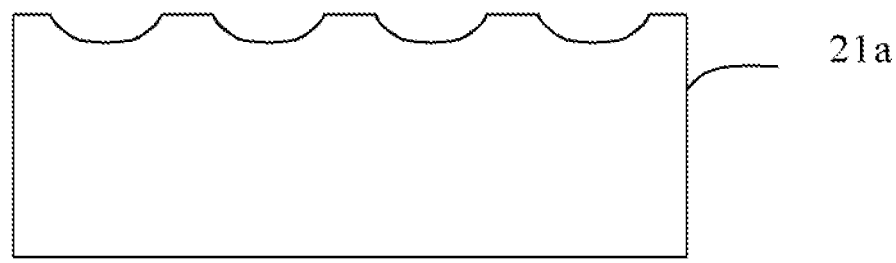

After wet etching, the hard mask layer 22 is removed as shown in FIG. 2C, and the plurality of depressions is formed on the patterned substrate 21a. The top-view pattern of the depression comprises circle or ellipse.

Figure 2D:
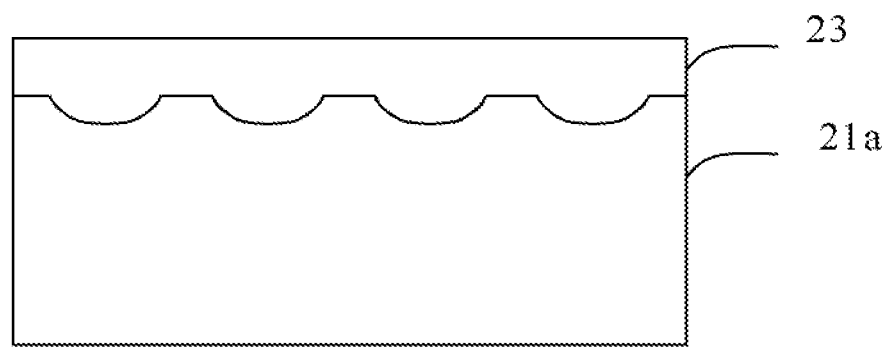
Figure 2E:
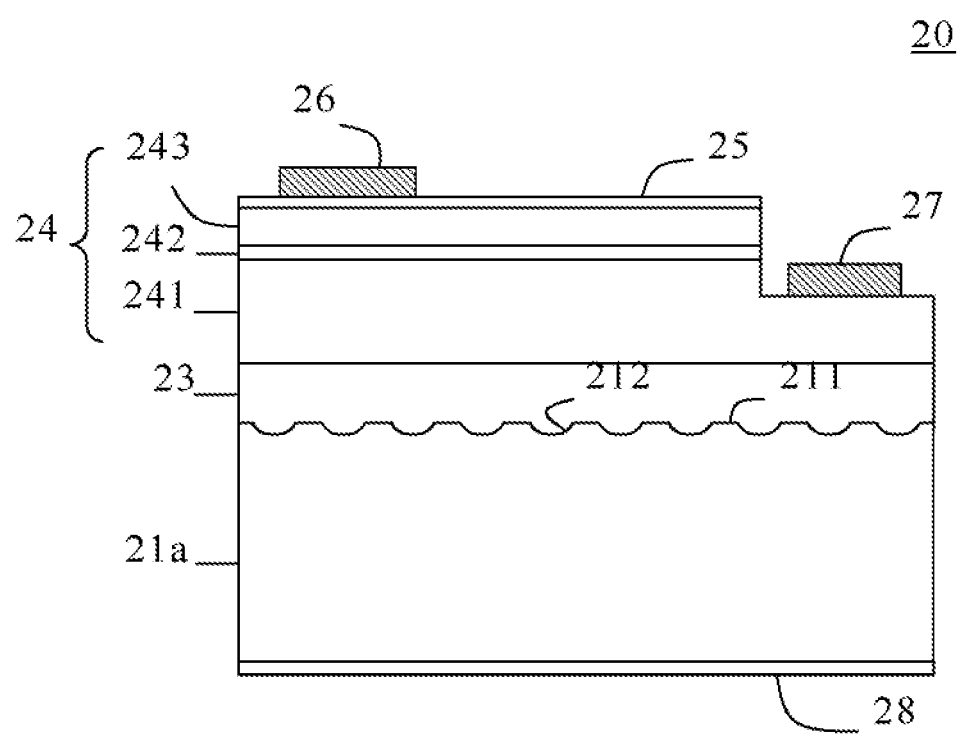

Next, a semiconductor buffer layer 23 is epitaxially grown on the patterned substrate 21a as shown in FIG. 2D. The semiconductor buffer layer 23 comprises at least one material selected from the group consisting of MN, GaN, InGaN, AlGaN, and other III-nitride materials. The semiconductor buffer layer 23 is substantially filled the depressions without forming cavities or voids to prevent the total reflection at the interface between the semiconductor buffer layer 23 and the voids. Therefore, the light is scattered by the depressions of the patterned substrate 21a.

After the formation of the semiconductor buffer layer 23, a light-emitting stack layer 24 and a transparent conductive layer 25 are sequentially formed thereon, as shown in FIG. 2D. In the preferred embodiment, the light-emitting stack layer 24 is made of GaN based materials and comprises a first semiconductor layer 241 of first conductivity-type, an active layer 242, and a second semiconductor layer 243 of second conductivity-type. The first conductivity-type is n-type or p-type, whereas the second conductivity-type is different from the first conductivity-type. The structure of the active layer 242 can be a double-heterojunction (DH) structure or a multi-quantum well (MQW) structure for achieving higher internal quantum efficiency. The transparent conductive layer 25 comprises metal or metallic oxide which is selected from the group consisting of nickel, gold, indium tin oxide, cadmium tin oxide, antimony tin oxide, indium zinc oxide, zinc aluminum oxide, and zinc tin oxide.

A portion of light-emitting stack layer 24 is removed by the conventional lithography-etching process so as to expose a portion of the first semiconductor layer 241. A first electrode 27 is formed on the exposed first semiconductor layer, and a second electrode 28 is formed on the transparent conductive layer 25. In a preferred embodiment, the method further comprises forming a reflecting layer 28 on the lower surface of the patterned substrate 21a for enhancing the light extracted from the sidewall of the substrate. The reflecting layer 28 comprises at least one material selected from the group consisting of Sn, Al, Au, Pt, Ag, Ti, Cu, PbSn, AuZn, SiO2, Al2O3, SiNx, and TiO2.

Figure 3:
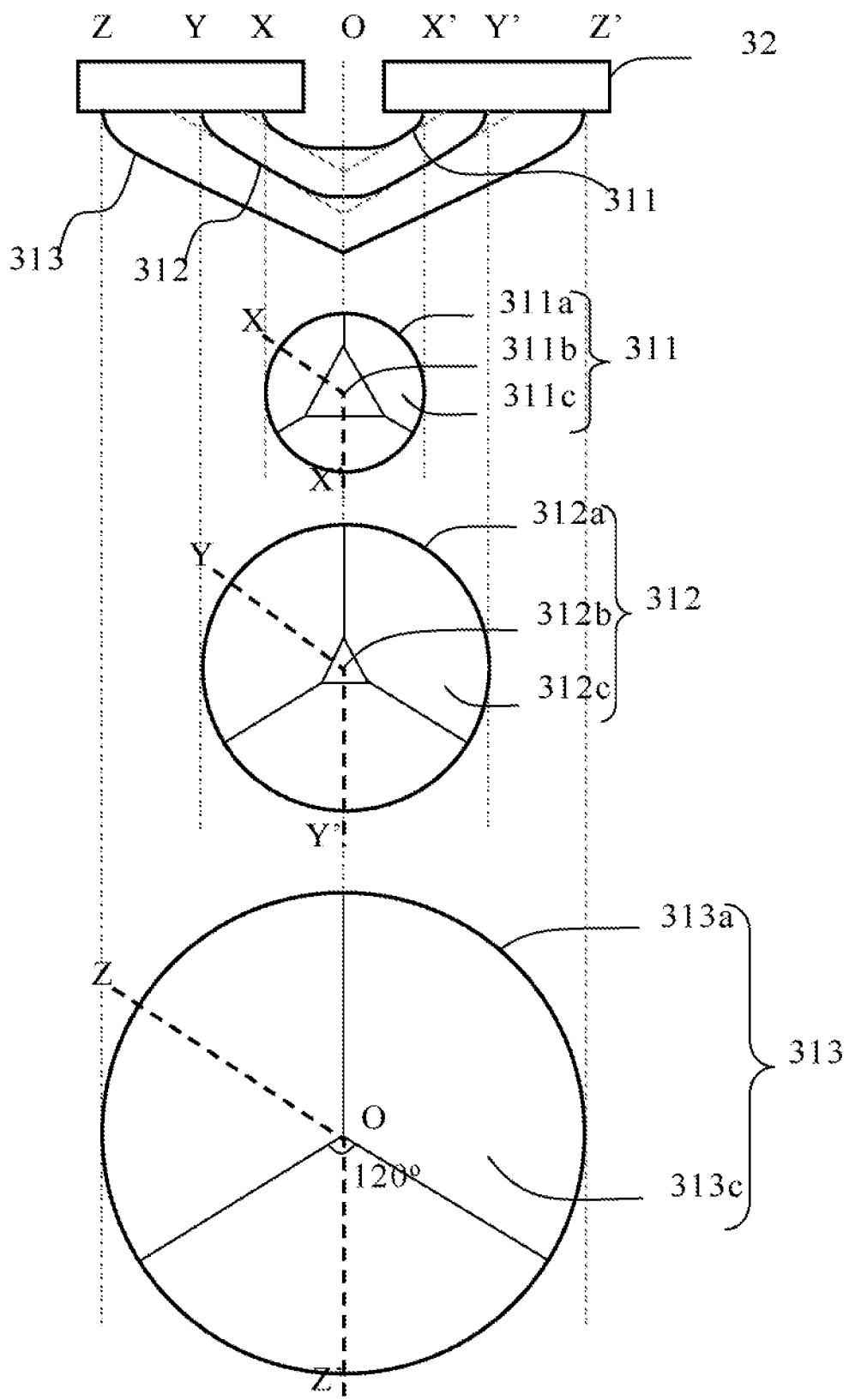
FIG. 3 shows the cross-sectional view and the corresponding top view of the patterned substrate in accordance with the first embodiment of the present disclosure.

FIG. 3 shows the cross-sectional views of the depression of the patterned substrate in different wet etching times. In one embodiment, the growth surface of the substrate comprises sapphire C plane. The shape of the top pattern of the depression is circle. The weight percentage of phosphoric acid to sulfuric acid is 2:1, and the operating temperature is about 320° C. The depressions 311, 312, and 313 are accordingly formed with the etching time of 60, 90, 120 seconds. The depression 311 is composed of an opening top portion 311a, a flat bottom portion 311b substantially shaped as a triangle, and a sidewall portion 311c comprising at least three symmetric planes. The sidewall portion 311c encloses the flat bottom portion 311b. The ratio of the bottom area of the flat bottom portion 311b to the top area enclosed by the opening top portion 311a is about 0.35. The flat bottom portion 311b comprises sapphire C plane, i.e. {0001} plane, and the sidewall portion 311b comprises sapphire R plane, i.e. {1-102} plane. The cross-section of the sidewall portion 311b near the top portion and the bottom portion is a curve for facilitating the subsequent epitaxy deposition, and the bottom corner of the depression is rounded. The depression 312 is similar to the depression 311 except for the ratio of the bottom area of the flat bottom portion 312b to the top area enclosed by the opening 312a being about 0.18. The depression 313, different from the depression 311 and depression 312, is only composed of an opening portion 313a and a sidewall portion 313b. The sidewall portion 313b comprises at least three symmetric planes intersected at a bottom point O. The cross-section of the sidewall portion 311b near the top portion is a curve for facilitating the subsequent epitaxy deposition.

It is clear from FIG. 3 that the flat bottom portion is gradually diminished and the sidewall portion is enlarged as the etching time increases. It is caused by the difference between the etching rate of sapphire C plane and that of sapphire R plane. More specifically, the etching rate of sapphire C plane is higher than that of sapphire R plane.

Figure 4A:
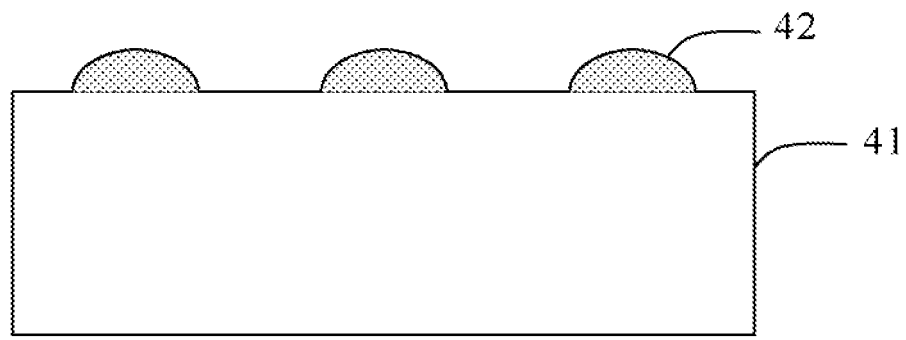
FIGS. 4A to 4D demonstrate the steps of another exemplary method for fabricating the light-emitting device in accordance with the second embodiment of the present disclosure.
Figure 4B:
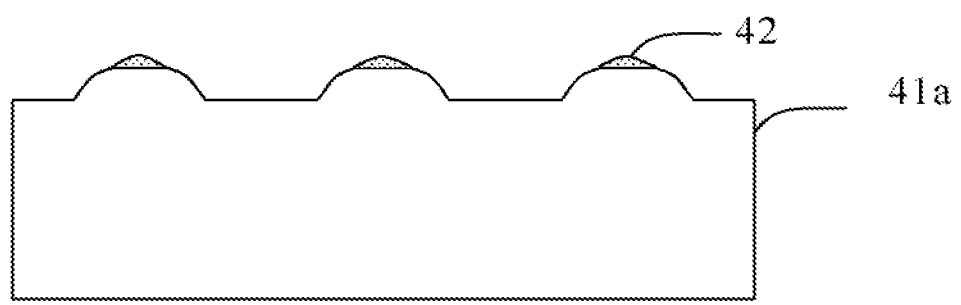
Figure 4C:
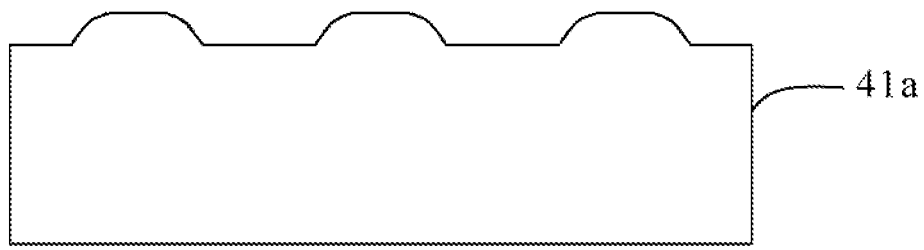
Figure 4D:
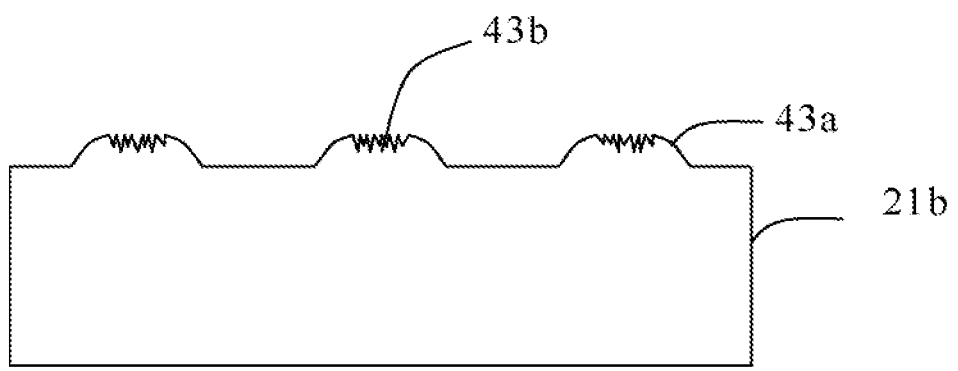

FIGS. 4A to 4D demonstrate another method for forming a patterned substrate in accordance with the second embodiment of the present disclosure. A substrate 41 is provided wherein the substrate 41 comprises at least one material selected from the group consisting of sapphire, GaN, SiC, Si, GaAs, and other substrate material that can be used to grown III-V semiconductor. Subsequently, a patterned photoresist layer 42 is formed on the substrate 41 as shown in FIG. 4A. The patterned photoresist layer 42 is prebaked on a hot plate with a temperature around 160° C. for reflowing and reshaping the patterned photoresist into a plurality of hemispheres, then performing etching process such as dry etching for defining and transferring the predetermined hemispherical pattern to the substrate as shown in FIG. 4B. After removing the remaining photoresist layer, a patterned substrate 41a is formed as shown in FIG. 4C. It is clear from FIG. 4C that the patterned substrate 41a comprises an uneven surface composed of a plurality of extrusions. The top-view pattern of the extrusion comprises circle or ellipse. Each of the plurality of extrusions comprises a top portion, a bottom portion, and a sidewall portion. The top portion and the bottom portion are both flat and substantially parallel. The sidewall portion is a curve for facilitating the subsequent epitaxy deposition. In a preferred embodiment, the top portion is further roughened by randomly etching the surface of the top portion to form an irregular pattern. The patterned substrate 41b, as shown in FIG. 4D, includes additionally an irregular pattern on part of the uneven surface capable of further improving the light extraction efficiency. It is also preferred to form a regular pattern replacing the irregular pattern. Still, it is optional to form either the regular or irregular pattern on at least one of the bottom portion, the top portion, and the sidewall portion, or the entire uneven surface of the patterned substrate in both the first and second embodiments.

Figure 5:
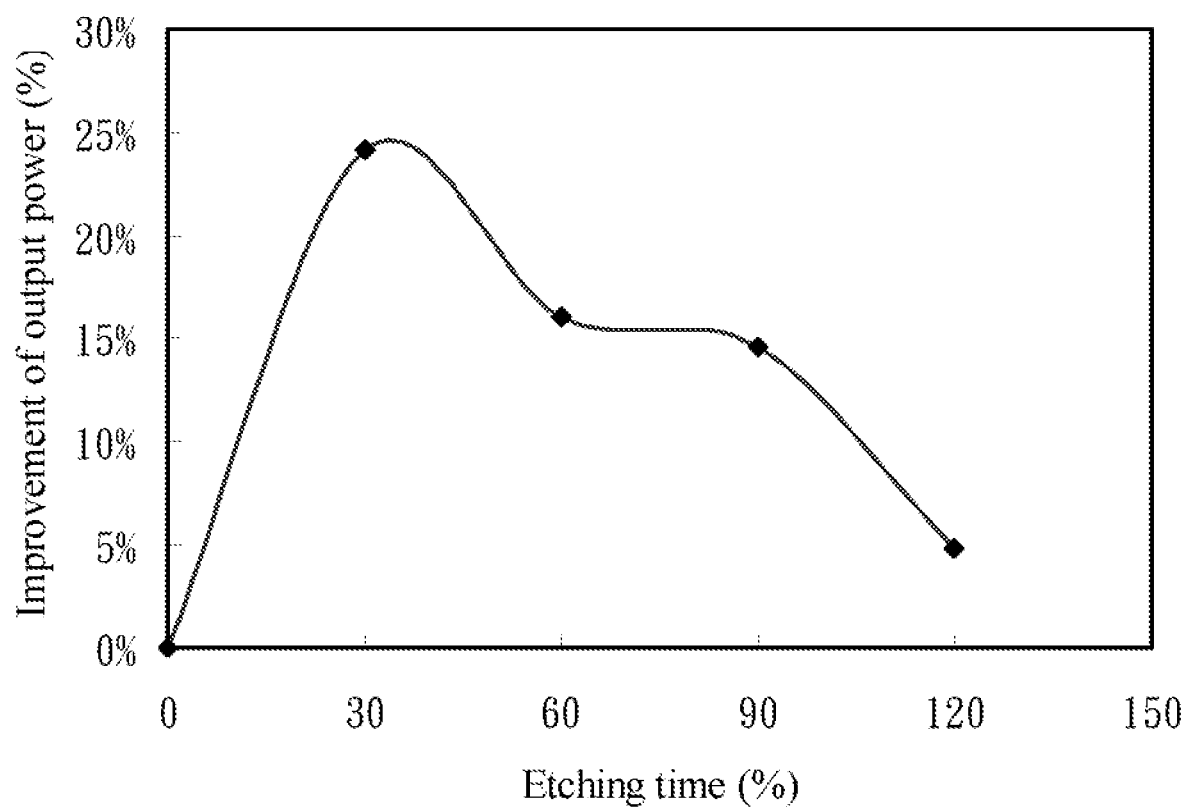
FIG. 5 shows the correlation curve of the output power dependent upon the various etching time in accordance with the first embodiment of the present disclosure.

FIG. 5 shows how the output power of the light-emitting device been affected by the patterned sapphire substrate formed under various etching times in accordance with the first embodiment. It is clear from the figure that comparing with the flat substrate, the patterned substrates formed under the etching time of 30, 60, 90, 120 seconds respectively have about 24%, 16%, 15%, and 5% improvement in the output power of the light-emitting device accordingly. The depression formed under the etching time of 120 seconds has only 5% improvement due to the near V-shape profile of such depression that does not facilitate the subsequent deposition of the semiconductor buffer layer. Nevertheless, it is conquerable for one with ordinary skill in the art by tuning the related parameters that are critical to the issue in the epitaxy deposition. It is preferred to form a depression having a flat bottom portion by controlling the etching time within a predetermined time. For example, the flat bottom portion of the depression can be formed under the etching time of about 15 to 100 seconds, and the ratio of the bottom area of the flat bottom portion to the top area enclosed by the opening of the depression is substantially between 0.15 and 0.75. Consequently, the output power is improved at least 10%.

Figure 6:
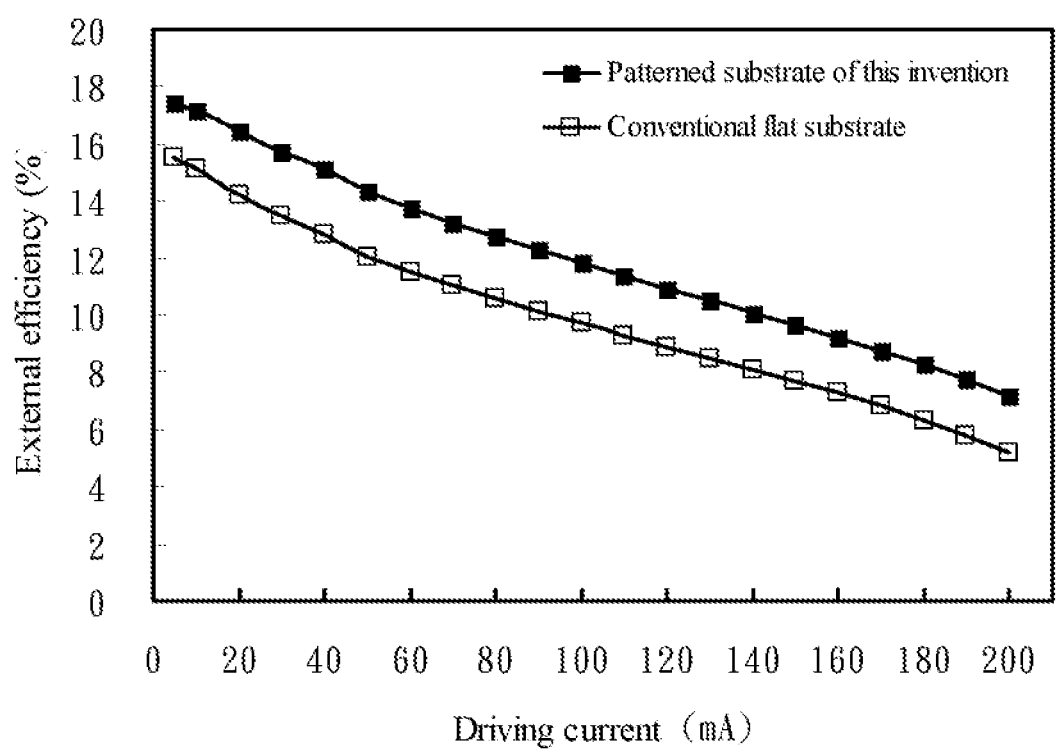
FIG. 6 shows the improvement of the output power of the present disclosure versus the conventional device in accordance with the first embodiment of the present disclosure.
Figure 7:
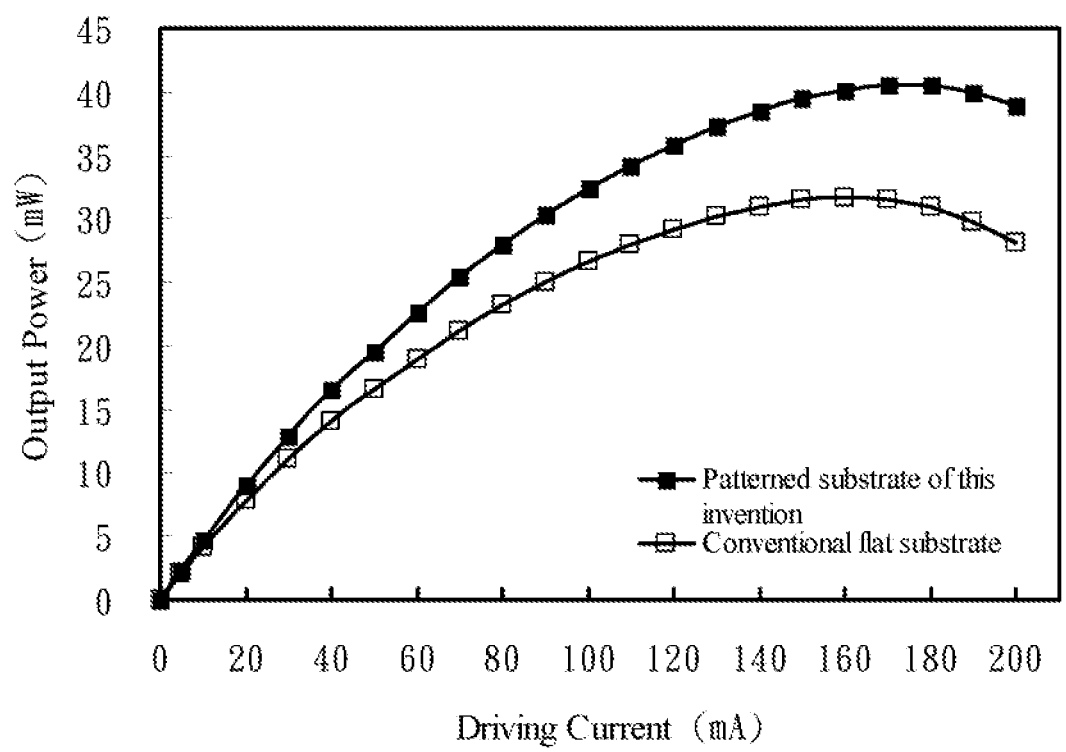
FIG. 7 shows the improvement of the external quantum efficiency of the present disclosure versus the conventional device in accordance with the first embodiment of the present disclosure.

FIG. 5 and FIG. 6 show another experimental results of the improvement of the external quantum efficiency and the output power by the effect of the patterned substrate according to the present disclosure, which are compared with the conventional flat substrate under various driving current conditions. It is clear from the figures that the light-emitting device in accordance with the present disclosure can achieve consistent enhancement no matter in external quantum efficiency or in output power while comparing with the conventional light-emitting device with a flat substrate under the driving current of 0 to 200 mA.

It should be noted that the proposed various embodiments are not for the purpose to limit the scope of the disclosure. Any possible modifications without departing from the spirit of the disclosure may be made and should be covered by the disclosure.

The invention claimed is:

1. A light-emitting device, comprising:
   a substrate comprising a boundary and a plurality of textured structures within the boundary, wherein the plurality of textured structures and the substrate are both composed of sapphire; and
   a light-emitting stack overlaying the plurality of textured structures, comprising a first conductivity type semiconductor layer, an active layer, and a second conductivity type semiconductor layer,
   wherein one of the plurality of textured structures comprises a circle pattern in a top view, and wherein the one of the plurality of textured structures is constituted by a portion and sidewall portions formed inside a periphery of the portion, the sidewall portions intersect at one point without forming a flat portion in a cross-sectional view of the light-emitting device.

2. The light-emitting device according to claim 1, wherein a cross-section of one of the sidewall portions is a curve.

3. The light-emitting device according to claim 1, wherein a cross-section of one of the sidewall portions near the periphery is a curve.

4. The light-emitting device according to claim 1, further comprising a semiconductor buffer layer directly formed on the substrate, wherein the semiconductor buffer layer comprises a III-nitride compound.

5. The light-emitting device according to claim 1, wherein the light-emitting stack comprises a III-nitride compound.

6. The light-emitting device according to claim 1, wherein the portion of the plurality of textured structures comprises a circle shape in a top view.

7. The light-emitting device according to claim 1, wherein the plurality of textured structures are spaced apart from each other.

8. The light-emitting device according to claim 1, wherein the sidewall portion comprises a sapphire R-plane.

9. The light-emitting device according to claim 1, wherein a portion of the light-emitting stack is removed to expose the first conductivity type semiconductor layer.

10. The light-emitting device according to claim 9, further comprising a first electrode formed on the exposed first conductivity type semiconductor layer, and a second electrode formed on the second conductivity type semiconductor layer.

11. The light-emitting device according to claim 10, further comprising a reflecting layer on a lower surface of the substrate.

12. The light-emitting device according to claim 11, wherein the reflecting layer comprises $SiO_2$, $Al_2O_3$, $SiN_x$ or $TiO_2$.

* * * * *